United States Patent
Hsu et al.

(10) Patent No.: US 8,759,141 B2
(45) Date of Patent: Jun. 24, 2014

(54) BACKSIDE DEPLETION FOR BACKSIDE ILLUMINATED IMAGE SENSORS

(71) Applicant: Taiwan Semiconductor Manufacturing Company, Ltd., Hsinchu (TW)

(72) Inventors: Tzu-Hsuan Hsu, Kaohsiung (TW); Han-Chi Liu, Miaoli (TW); Ching-Chun Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/875,659

(22) Filed: May 2, 2013

(65) Prior Publication Data

US 2013/0244368 A1    Sep. 19, 2013

Related U.S. Application Data

(60) Division of application No. 12/107,199, filed on Apr. 22, 2008, now Pat. No. 8,436,443, which is a continuation-in-part of application No. 11/774,681, filed on Jul. 9, 2007, now abandoned.

(60) Provisional application No. 60/827,611, filed on Sep. 29, 2006.

(51) Int. Cl.
*H01L 21/00*         (2006.01)

(52) U.S. Cl.
USPC ............... 438/73; 438/75; 257/447; 257/460

(58) Field of Classification Search
USPC .................. 438/73, 75; 257/447, 460
See application file for complete search history.

(56) References Cited

U.S. PATENT DOCUMENTS

| | | | |
|---|---|---|---|
| 4,154,632 | A | 5/1979 | Mochizuki et al. |
| 4,193,826 | A | 3/1980 | Mochizuki et al. |
| 4,199,386 | A | 4/1980 | Rosnowsk et al. |
| 4,290,830 | A | 9/1981 | Mochizuki et al. |
| 4,390,889 | A | 6/1983 | Capasso et al. |
| 4,507,674 | A | 3/1985 | Gaalema |
| 4,760,031 | A | 7/1988 | Janesick |
| 5,005,063 | A | 4/1991 | Janesick |
| 5,244,817 | A | 9/1993 | Hawkins et al. |

(Continued)

FOREIGN PATENT DOCUMENTS

| | | |
|---|---|---|
| CN | 1716628 | 1/2006 |
| CN | 1838423 | 9/2006 |

(Continued)

OTHER PUBLICATIONS

CIPO, Office Action, Application No. 2008101276973, Jul. 3, 2009, 20 pgs.

(Continued)

*Primary Examiner* — Daniel Whalen
(74) *Attorney, Agent, or Firm* — Haynes and Boone, LLP

(57) ABSTRACT

A backside illuminated image sensor is provided which includes a substrate having a front side and a backside, a sensor formed in the substrate at the front side, the sensor including at least a photodiode, and a depletion region formed in the substrate at the backside, a depth of the depletion region is less than 20% of a thickness of the substrate.

20 Claims, 11 Drawing Sheets

(56) References Cited

U.S. PATENT DOCUMENTS

| | | |
|---|---|---|
| 5,511,428 A | 4/1996 | Goldberg |
| 5,688,715 A | 11/1997 | Sexton et al. |
| 6,168,965 B1 | 1/2001 | Malinovich et al. |
| 6,169,319 B1 | 1/2001 | Malinovich et al. |
| 6,227,055 B1 | 5/2001 | Pitzer |
| 6,259,085 B1 | 7/2001 | Holland |
| 6,340,831 B1 | 1/2002 | Kuhara et al. |
| 6,429,036 B1 | 8/2002 | Nixon et al. |
| 6,504,196 B1 | 1/2003 | Rhodes |
| 6,593,636 B1 | 7/2003 | Bul et al. |
| 6,635,912 B2 | 10/2003 | Ohkubo |
| 6,762,473 B1 | 7/2004 | Goushcha et al. |
| 6,765,276 B2 | 7/2004 | Fasen et al. |
| 6,821,809 B2 | 11/2004 | Abe et al. |
| 6,884,651 B2 | 4/2005 | Toyoda et al. |
| 6,946,352 B2 | 9/2005 | Yaung |
| 6,949,809 B2 | 9/2005 | Takimoto et al. |
| 7,462,889 B2 | 12/2008 | Yagyu et al. |
| 2001/0017344 A1 | 8/2001 | Aebi |
| 2004/0169625 A1 | 9/2004 | Park et al. |
| 2004/0178350 A1 | 9/2004 | Nagano et al. |
| 2005/0087829 A1 | 4/2005 | Merrill et al. |
| 2005/0090035 A1 | 4/2005 | Kim |
| 2006/0043519 A1 | 3/2006 | Ezaki |
| 2006/0057759 A1 | 3/2006 | Zhang et al. |
| 2006/0121640 A1 | 6/2006 | Kim |
| 2006/0197171 A1 | 9/2006 | Zhang et al. |
| 2006/0267123 A1 | 11/2006 | Wu |
| 2007/0001100 A1 | 1/2007 | Hsu et al. |
| 2007/0052056 A1* | 3/2007 | Doi et al. .................. 257/462 |
| 2007/0117253 A1 | 5/2007 | Hsu et al. |
| 2007/0207566 A1 | 9/2007 | Fu et al. |
| 2008/0224247 A1 | 9/2008 | Hsu |

FOREIGN PATENT DOCUMENTS

| | | |
|---|---|---|
| JP | 2002151676 | 5/2002 |
| JP | 2004319610 | 11/2004 |
| KR | 1020020005990 | 1/2002 |
| KR | 10-2005103782 | 11/2005 |

OTHER PUBLICATIONS

CIPO, Office Action, Application No. 2008101276973, Nov. 20, 2009, 5 pgs.

CIPO, Office Action, Application No. 200810127697.3, Apr. 13, 2010, 3 pgs.

CIPO, Office Action, Application No. 2007101532640, Feb. 9, 2009, 5 pgs.

KIPO, Notice of Preliminary Rejection, Application No. 10-2007-0045138, May 28, 2008, 8 pgs. with English translation.

Bosiers, J.T., et al., "Deep-depletion CCDS with Improved UV Sensitivity," IEDM, vol. 31, 1985, pp. 448-451.

Williams, George M., "Back-Illuminated CCD Imagers for High Information Content Digital Photography", SPIE, vol. 3302, Apr. 1998, pp. 39-53.

\* cited by examiner

US 8,759,141 B2

BACKSIDE DEPLETION FOR BACKSIDE ILLUMINATED IMAGE SENSORS

PRIORITY DATA

This application is a divisional application of U.S. application Ser. No. 12/107,199, filed Apr. 22, 2008 which is a continuation-in-part of U.S. application Ser. No. 11/774,681, filed on Jul. 9, 2007, entitled "METHOD FOR IMPROVING SENSITIVITY OF BACKSIDE ILLUMINATED IMAGE SENSORS" which claims priority to U.S. Provisional Patent Application No. 60/827,611, filed on Sep. 29, 2006, the entire disclosures of which are incorporated herein by reference.

BACKGROUND

An image sensor provides a grid of pixels, such as photosensitive diodes or photodiodes, reset transistors, source follower transistors, pinned layer photodiodes, non-pinned layer photodiodes and/or transfer transistors, for recording an intensity or brightness of light. The pixel responds to the light by accumulating a charge—the more light, the higher the charge. The charge can be processed by another circuit so that a color and brightness can be used for a suitable application, such as a digital camera. Common types of pixel grids include a charge-coupled device (CCD) or complimentary metal oxide semiconductor (CMOS) image sensor.

Backside illuminated sensors are used for sensing a volume of exposed light projected towards the backside surface of a substrate. Backside illuminated sensors provide a high fill factor and reduced destructive interference, as compared to front-side illuminated sensors. The pixels are located on a front side of the substrate, and the substrate is thin enough so that light radiation projected towards the backside of the substrate can reach the pixels. Accordingly, the substrate is thinned to a reasonable thickness to provide a desired photo response and reduce cross-talk. However, the process of thinning the substrate may cause damage to the silicon crystal lattice which can lead to an increase in dark current for the image sensor device. That is, unwanted current generated by pixels in the absence of illumination. There may be other sources for dark current such as impurities in the silicon wafer and heat build up in the pixel area. Excessive dark current may lead to image degradation and poor device performance.

A need exists for a device and method that provides a backside illuminated image sensor with reduced dark current without adversely affecting the performance of the device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
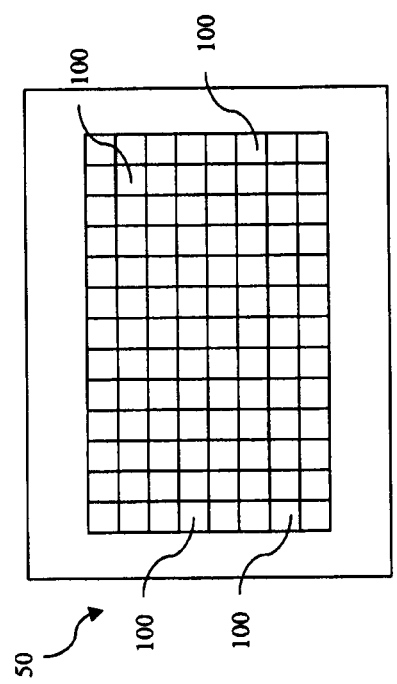
FIG. 1 is a top view of a backside illuminated image sensor device including a plurality of pixels.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an image sensor 50 provides a grid or an array of backside illuminated (or back-illuminated) pixels 100. In the present embodiment, the pixels 100 include photosensitive diodes or photodiodes, for recording an intensity or brightness of light on the diode. The pixels 100 may further include reset transistors, source follower transistors, and transfer transistors. The image sensor 50 can be of various different types, including a charge-coupled device (CCD), a complimentary metal oxide semiconductor (CMOS) image sensor (CIS), an active-pixel sensor (ACP), or a passive-pixel sensor. Additional circuitry and input/outputs are typically provided adjacent to the grid of pixels 100 for providing an operation environment for the pixels and for supporting external communications with the pixels.

Figure 2:
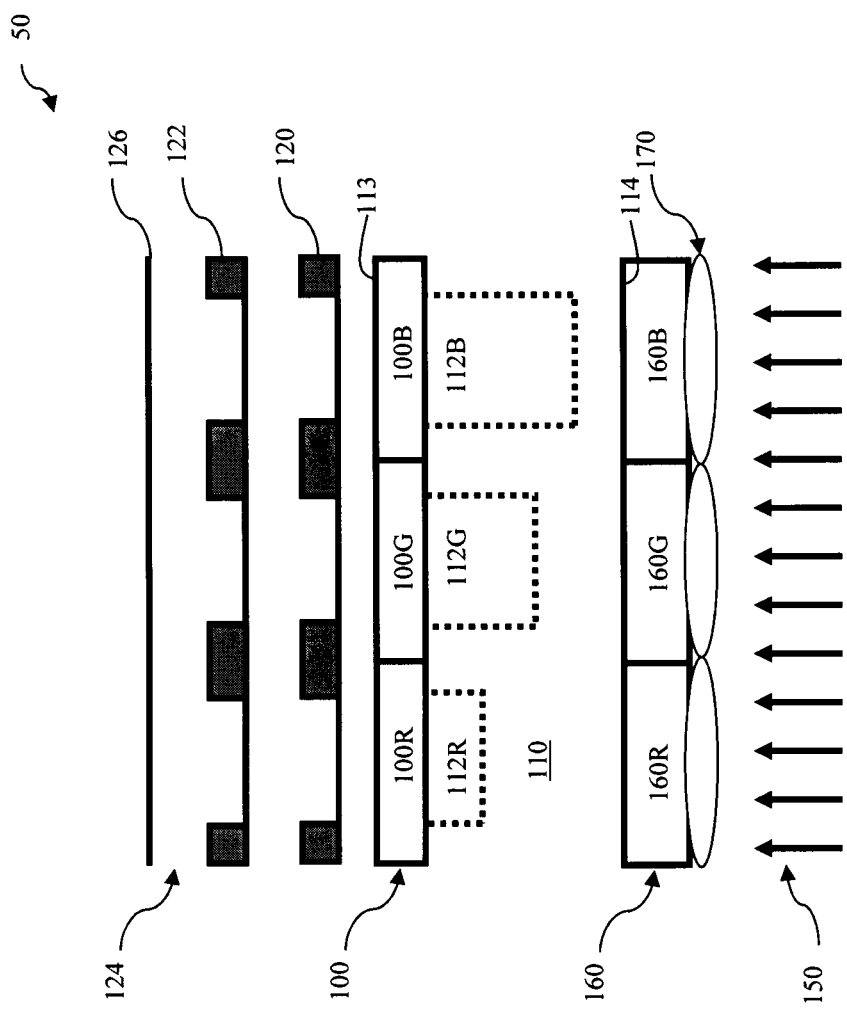
FIG. 2 is a cross-sectional view of the image sensor device of FIG. 1.

Referring now to FIG. 2, the image sensor 50 includes a substrate 110. The substrate 110 may comprise an elementary semiconductor such as silicon, germanium, and diamond. Alternatively, the substrate 110 may optionally comprise a compound semiconductor such as silicon carbide, gallium arsenic, indium arsenide, and indium phosphide. Also, semiconductor arrangements such as silicon-on-insulator and/or an epitaxial layer (also referred to as an "epilayer") can be provided. The substrate 110 may comprise an alloy semiconductor such as silicon germanium, silicon germanium carbide, gallium arsenic phosphide, and gallium indium phosphide. In the present embodiment, the substrate 110 comprises a p– epilayer. The substrate 110 includes a front side surface 113 and backside surface 114. All doping may be implemented using a process such as ion implantation or diffusion in various steps. Different dopings, including p-type or n-type, may be used. The substrate 110 may further include lateral isolation features (not shown) to separate different devices formed on the substrate.

The sensor 50 includes a plurality of pixels 100 formed in the substrate 110 underneath the front surface 113 of the substrate. For the sake of example, the pixels are further labeled 100R, 100G, and 100B to correspond with example light wavelengths of red, green, and blue, respectively. The pixel 100 may include a photodiode for sensing an amount of light radiation directed towards the pixel from the back surface of the substrate 110. The photodiode may include a pinned layer photodiode. The pinned layer photodiode may comprise of an n-type doped region formed in the p− epilayer and a heavily doped p-type region (referred also as p+ pinned layer) formed on the surface of the n-type doped region. Accordingly, the p-n-p junction region (referred also as the depletion region) makes up a light sensing region 112 of the photodiode. Alternatively, the photodiode may optionally include a non-pinned layer photodiode. In continuance of the present example, the light sensing regions are further labeled 112R, 112G, and 112B to correspond with the pixels 100R, 100G, and 100B, respectively.

As previously discussed, the image sensor 50 may be configured as an active-pixel sensor wherein each pixel 100 includes a photodiode and a number of transistors. The pixel 100 may be configured to absorb light radiation and generate optical charges or photo-electrons that are collected and accumulated in the light sensing region 112 of the photodiode. The transistors may be configured to readout the generated photo-electrons and convert them into an electrical signal. The transistors include reset transistors, source follower transistors, transfer transistors, and other suitable transistors.

The image sensor 50 may further include additional layers, including first and second interconnect metal layers 120, 122 and inter-layer dielectric 124, formed on the front surface 113 of the substrate 110. The interconnect metal layers provide connections between the various microelectronic devices of the image sensor 50. The inter-layer dielectric 124 comprises a low-k material, as compared to a dielectric constant of silicon dioxide. Alternatively, the inter-layer dielectric 124 may comprise carbon-doped silicon oxide, fluorine-doped silicon oxide, silicon oxide, silicon nitride, and/or organic low-k material. The inter-layer dielectric may be formed by a technique including spin-on, CVD, or sputtering. The material of the metal layers 120 and 122 may include aluminum, copper, tungsten, titanium, titanium nitride, tantalum, tantalum nitride, metal silicide or combination thereof. Additionally, the interconnect metal layers 120, 122 and inter-layer dielectric 124 may be formed in an integrated process such as a damascene process or lithography/plasma etching process. The image sensor 50 may further include a passivation layer 126 for protecting the image sensor.

Additional circuitry also exists to provide an appropriate functionality to handle the type of pixels 100 being used and the type of light being sensed. It is understood that the wavelengths red, green, and blue are provided for the sake of example, and that the pixels 100 are generally illustrated as being photodiodes for the sake of example.

The image sensor 50 is designed to receive light radiation 150 directed towards the back surface 114 of the substrate 110 during applications, eliminating any obstructions to the optical paths by other objects such as gate features and metal lines, and maximizing the exposure of the light-sensing region 112 to the illuminated light. The substrate 110 may be thinned such that the light 150 directed through the back surface 114 thereof may effectively reach on the photodiodes. The illuminated light 150 may not be limited to visual light beam, but can be infrared (IR), ultraviolet (UV), and other radiation beam.

The image sensor 50 may further include a color filter layer 160 formed on the back surface 114 of the substrate 110. The color filter layer 160 can support several different color filters (e.g., red, green, and blue), and may be positioned such that the incident light is directed thereon and there through. In one embodiment, such color-transparent layers may comprise a polymeric material (e.g., negative photoresist based on an acrylic polymer) or resin. The color filter layer 160 may comprise negative photoresist based on an acrylic polymer including color pigments. In continuance of the present example, color filters 160R, 160G, and 160B correspond to pixels 100R, 100G, and 100B, respectively. The image sensor 50 may further include a plurality of micro-lens(es) 170 formed over the color filter layer 160 such that the backside-illuminated light can be focused on the light-sensing regions 112.

When light radiation 150 is directed through the back surface 114 of the substrate 110, electrons may be absorbed by the substrate 110 before reaching light sensing region 112 of the photodiode. For example, a problem exists when blue light is directed through the residual substrate 110, electrons are generated much closer to the backside surface 114. As a result, many of the electrons are quickly absorbed by the substrate 110 and less electrons will reach the light sensing region 112 of photodiode. This leads to poor photo sensitivity and poor pixel performance.

Figure 3:
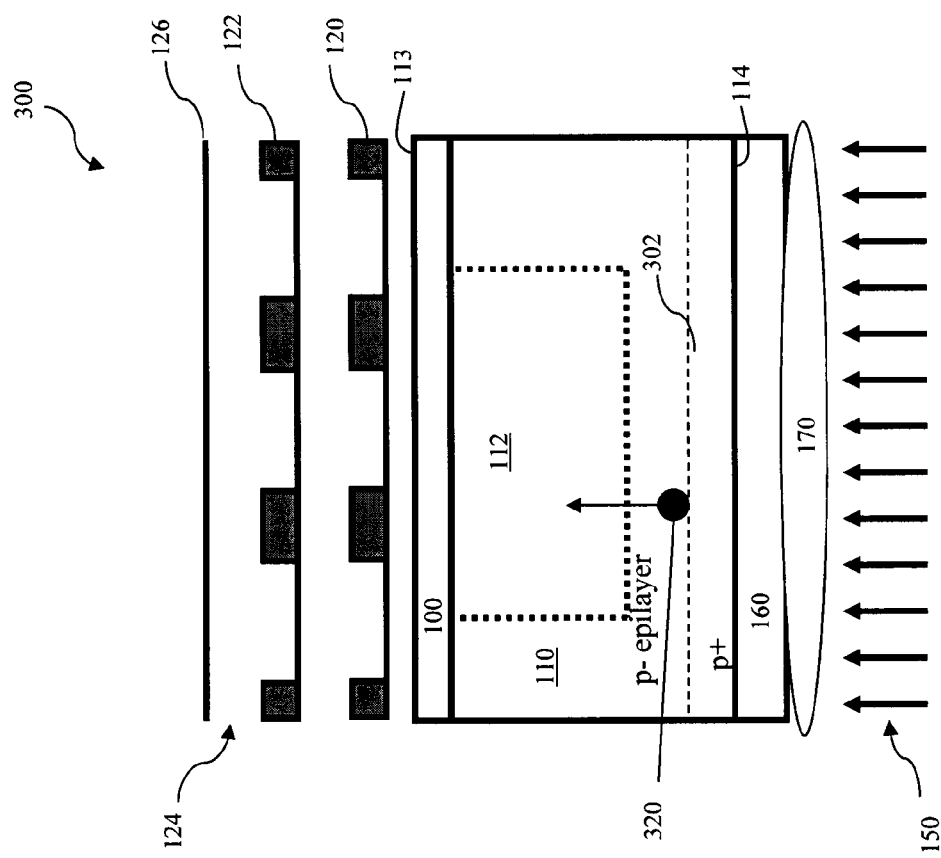
FIG. 3 is a cross-sectional view of a backside illuminated image sensor with an extended light sensing region and a shallow p+ doped layer.

Aspects of the present disclosure provide for improving sensitivity of backside illuminated image sensors by first reducing the thickness of the substrate 110 prior to implanting the p+ ions at the backside surface 114 of the substrate. Referring to FIG. 3, a backside illuminated image sensor 300 with a shallow p+ doped layer 302 at the backside is depicted. The image sensor 300 is similar to the image sensor 50 of FIGS. 1 and 2 except for the differences noted below. Similar features in FIGS. 1-3 are numbered the same for clarity. In this example, the image sensor 300 is shown with only one pixel 100 for simplicity and a better understanding of the present embodiment.

The resistance of substrate 110 may be first increased to extend the light sensing region 112. In this example, the resistance of p− epilayer is increased from about 10 ohm to about 100 ohm. This causes the light sensing region 112 to extend closer to the backside surface 114 of the p− epilayer. The typical thickness of the substrate 110 before thinning is about 745 μm. In one embodiment, the thinning of the substrate 110 may be accomplished by grinding down the substrate followed by conventional multi-step wet etching to reduce the substrate to a desired thickness in order to provide the desired photo response (sensitivity) and reduce cross-talk between pixels 100. Alternatively, the thinning of the substrate 110 may optionally be accomplished by chemical mechanical planarization (CMP) which uses a combination of mechanical polishing and chemical reaction.

Once the substrate 110 is thinned to the desired thickness, an implantation of p+ ions may be performed on the backside surface 114 of the p− epilayer to form the shallow p+ doped layer 302 at the backside. In an illustrative embodiment, the shallow p+ doped layer 302 may have a thickness of about 100 A to about 1 μm and preferably about 100 A to about 1000 A. The dopant may include a p-type dopant, such as boron, $BF_2$, or other suitable material. The implantation energy used to implant the shallow p+ doped layer 302 may be between about 500 eV to about 500 KeV. The concentration of the shallow p+ doped layer 302 may be between about $1e16\ cm^{-3}$ to about $1e21\ cm^{-3}$.

By providing the shallow p+ doped layer 302 at the backside surface 114, the potential difference between the p− epilayer and the p+ doped layer 302 is increased. Thus, electrons 320 may reach the light sensing region 112 of the photodiode more easily without being absorbed by the p− epilayer. To provide a better electron response to blue light, the thickness of the shallow p+ doped layer 302 should be preferably less than 1000 A or 0.1 um.

Figure 4:
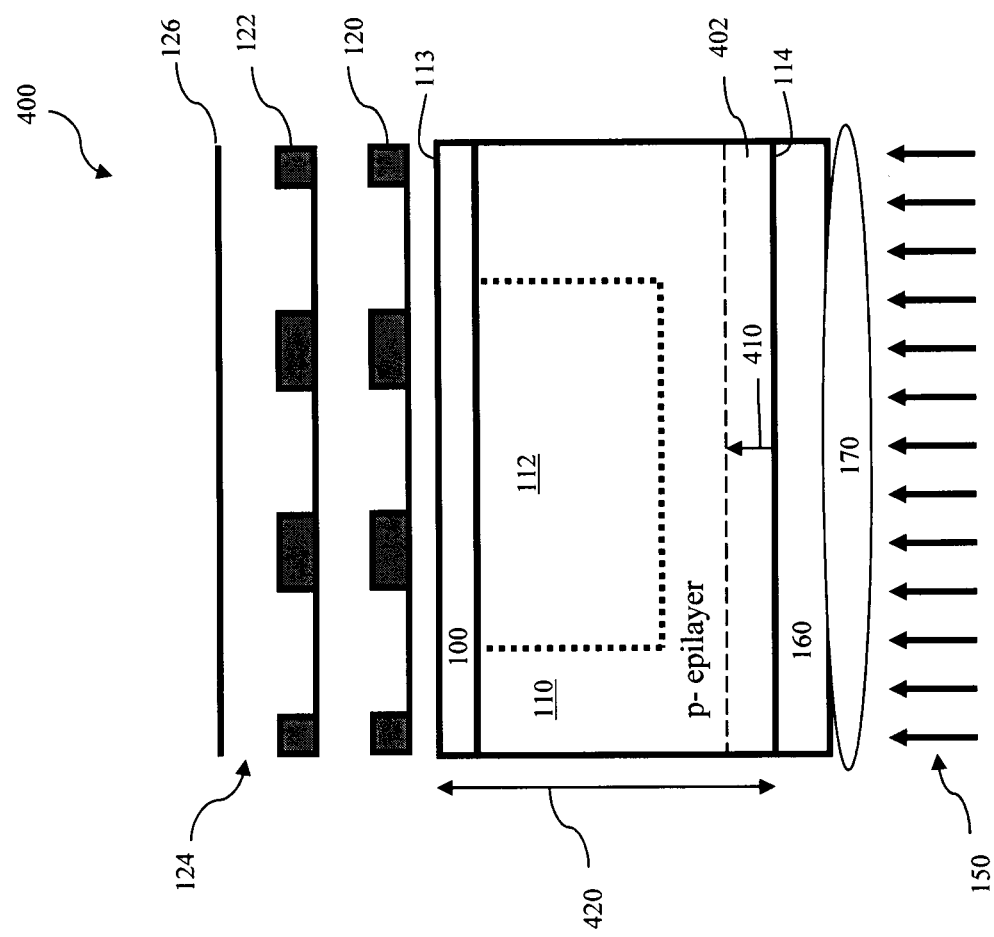
FIG. 4 is a cross-sectional view of a backside illuminated image sensor with a backside depletion region.

Once the shallow p+ doped layer 302 is formed, an annealing may be performed using a laser to activate the implantation of p+ ions. In this illustrative embodiment, laser annealing is preferred over conventional annealing techniques, such as Rapid Thermal Annealing (RTA), because the high temperature required for RTA may cause damage to the image sensor 300. In particular, high temperatures over 450° C. may cause the metal layers 120 and 122 of image sensor 300 to melt. Since laser annealing only requires a high temperature at the backside surface 114, the metal layers 120 and 122 of the image sensor 300 will not be affected. Once the p+ ion implantation is activated by laser annealing, fewer out diffusions occur from the shallow p+ doped layer 302 to the p− epilayer. As a result, the shallow p+ doped layer 302 provides electrical grounding and reduces leakage current of the image sensor 300 and at the same time improves photo sensitivity, especially for blue light. Accordingly, quantum efficiency (percentage of incident light that is detected) of the image sensor 300 is improved During thinning of the substrate 110, the backside surface 114 may be damaged which can lead to an increase in dark current. That is, unwanted current (charges) generated in the absence of light radiation. This can lead to poor device performance. The p+ doped layer 302 of FIG. 3 at the backside can reduce dark current and improve quantum efficiency. Additionally, aspects of the present disclosure provide for further reducing dark current without degrading quantum efficiency by providing a backside depletion region. Referring to FIG. 4, a backside illuminated image sensor 400 having a backside depletion region 402 is depicted. The image sensor 400 is similar to the image senor 300 of FIG. 3. Similar features in FIGS. 3 and 4 are numbered the same for clarity. The backside depletion region 402 has a depth 410 that is 20% less than a thickness 420 of the substrate 110. In some embodiments, the thickness 420 of the substrate 110 may be about 1 µm to about 5 µm. In some other embodiments, the depth 410 of the depletion region 402 may be less than 1000 A. The charges (e.g., electrons) that are generated at the backside surface 114 in the absence of light are collected in the backside depletion region 402 and thus, do not reach the light sensing region 112 of the photodiode. Accordingly, dark current in the image sensor 400 may be reduced.

Figure 5:
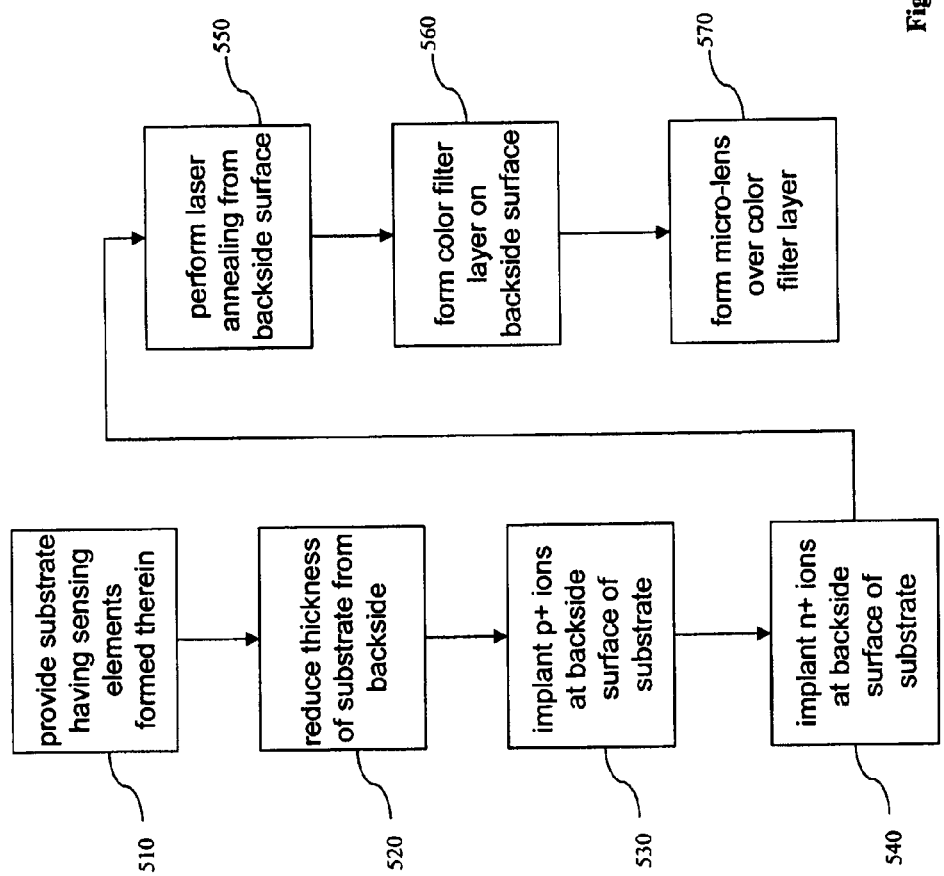
FIG. 5 is a flowchart of an exemplary method for fabricating the backside illuminated image sensor of FIG. 4.

Referring to FIG. 5, a flowchart of a method 500 for fabricating the backside illuminated image sensor 400 of FIG. 4 is depicted. Referring also to FIGS. 6a-6d, illustrated is the image sensor 400 of FIG. 4 at various stages of fabrication in accordance with the method 500 of FIG. 5. The method 500 begins in block 510 in which a substrate 110 is provided having a plurality of sensing elements formed in the substrate underneath the front surface 113. Each sensing element includes at least a photodiode such as a pinned layer photodiode having a light sensing region 112. Further, the image sensor 400 may be configured as an active-pixel sensor wherein each pixel 100 includes a photodiode and a number of transistors (not shown). Additionally, interconnect metal layers 120, 124 and inter-layer dielectric 124 may be formed on the front surface 113 of substrate 110. Further, a passivation layer 126 may be formed over the metal layers 120, 122 and inter-layer dielectric.

Figure 6A:
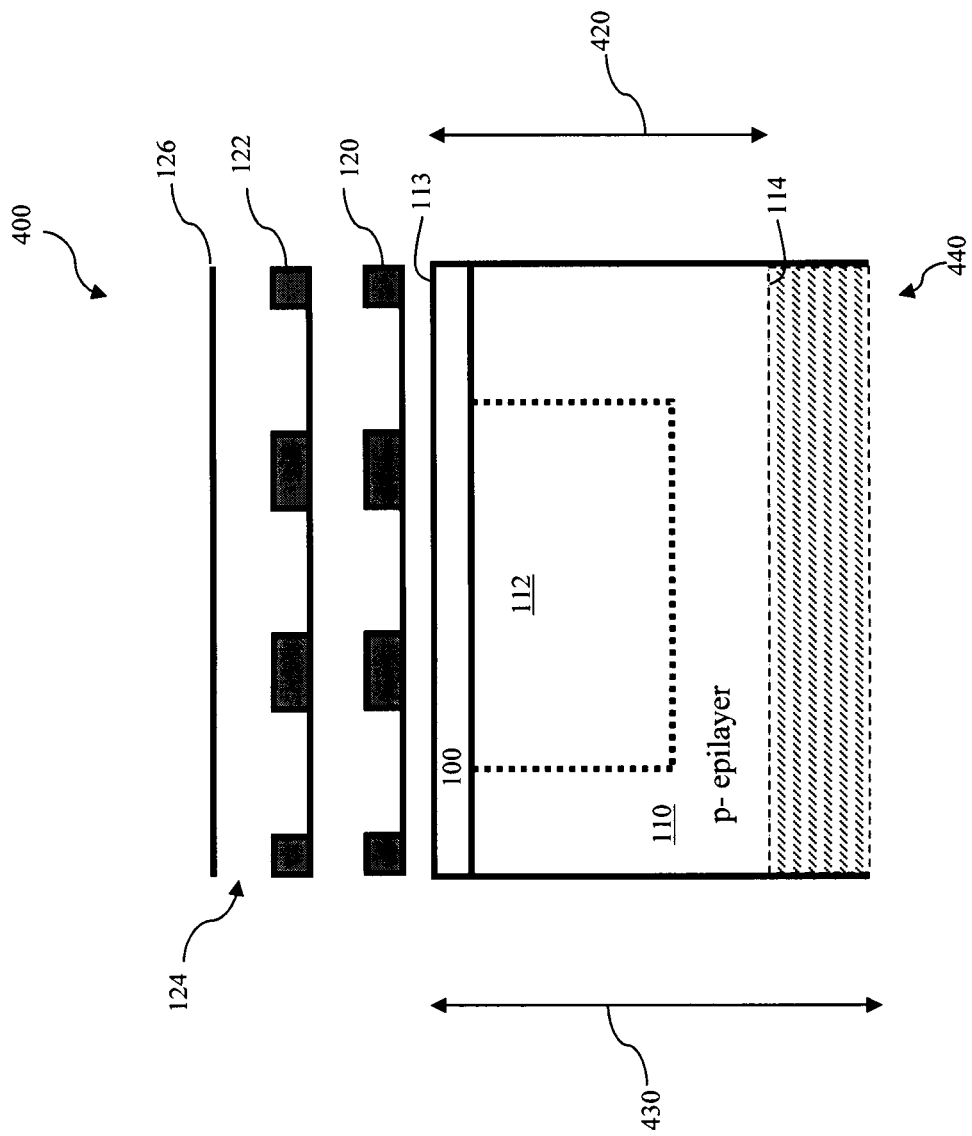
FIGS. 6a-6e are cross-sectional views of the backside illuminated image sensor of FIG. 4 at various stages of fabrication in accordance with the method of FIG. 5.
Figure 6B:
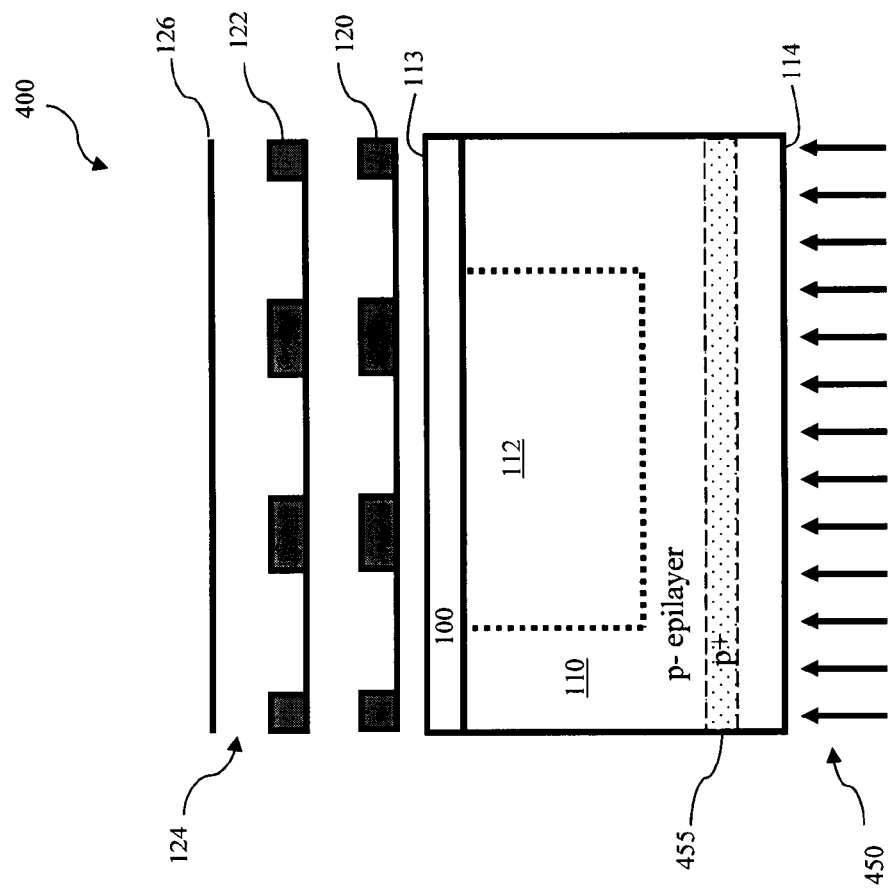

In FIG. 6a, the image sensor 400 is shown after formation of various components at the front surface 113 as discussed above. In the present example, the substrate 110 may include an p− epilayer and may have an initial thickness 430. The typical thickness 430 of the substrate 110 before thinning is about 745 µm. The method 500 continues with block 520 in which the thickness of the substrate 110 is reduced from the back surface 440. The substrate 110 may be thinned by first grinding down the substrate followed by multi-step wet etching, or CMP to reduce the substrate to a desired thickness 420. The thickness 420 of the substrate 110 may be about 1 µm to about 5 µm. In FIG. 6b, the method 500 continues with block 530 in which p+ ions may be implanted 450 at the backside surface 114 of the substrate 110 to form a p+ doped layer 455. In the present example, the p+ doped layer 455 has a reverse conductivity type to a minority carrier (e.g., electrons) associated with charges generated in the image sensor 400. Accordingly, the dopant may include a p-type dopant, such as boron, $BF_2$, or other suitable material. The implantation energy range is between about 500 eV to about 50 KeV. The dosage of about 10e3 atoms/cm$^2$ to about 50e5 atoms/cm$^2$ may be utilized. The depth of the p+ doped layer may vary and will depend on the implantation energy used.

Figure 6C:
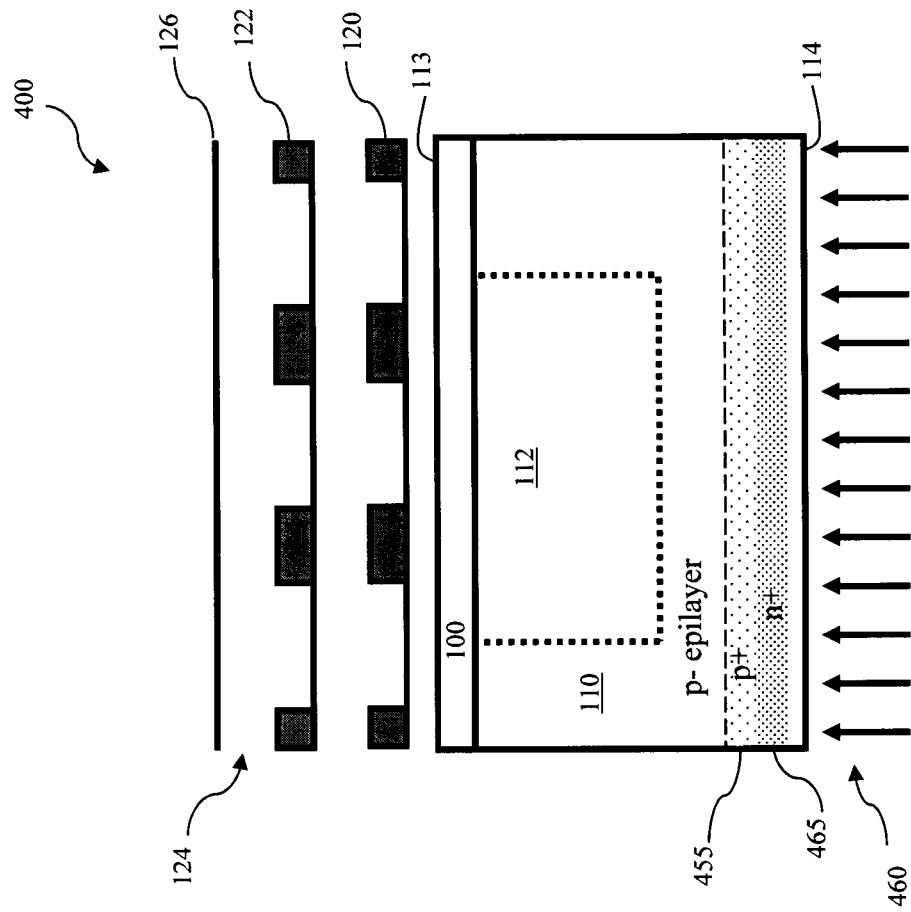
Figure 6D:
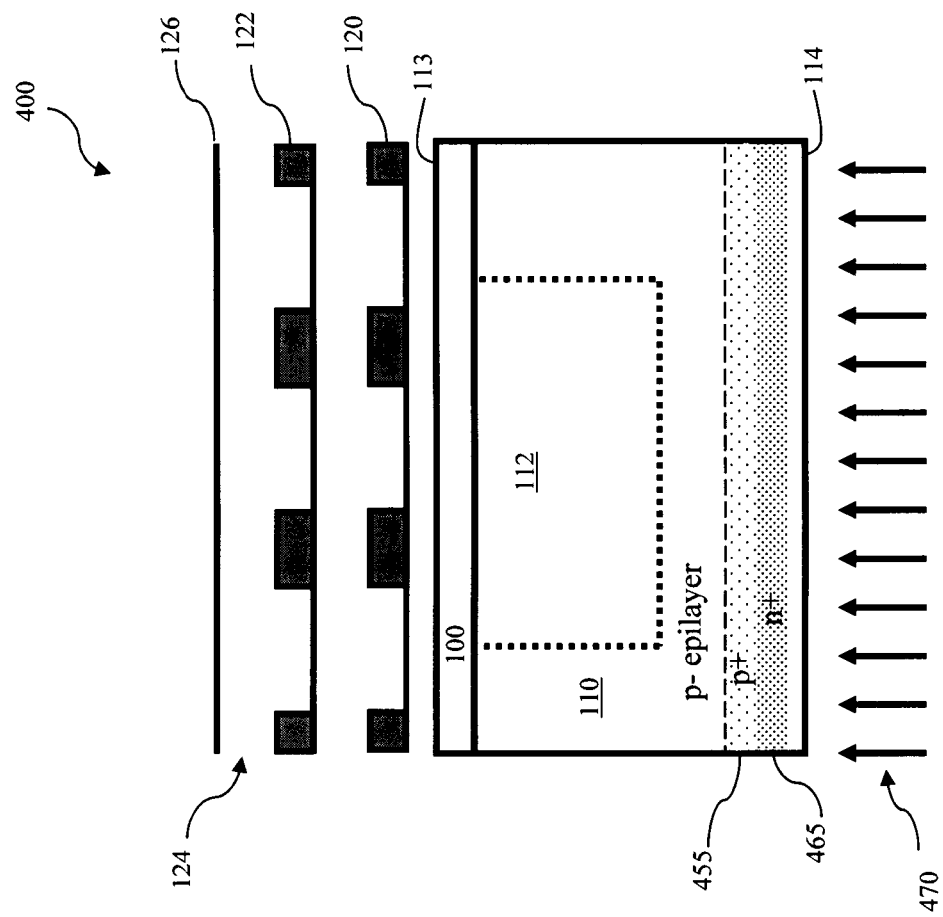

In FIG. 6c, the method 500 continues with block 540 in which n+ ions may be implanted 460 from the backside surface 114 of the substrate 110 to form an n+ doped layer 465. In the present embodiment, the n+ ions may be implanted 460 at a depth (from the backside surface 114) that is less than the depth of the p+ ions implanted in block 530. That is, the n+ doped layer 465 is located between the p+ doped layer 455 and the backside surface 114. The dopant may include an n-type dopant, such as As, P, or other suitable material. The implantation energy used to implant the n+ ions may be between about 500 eV to about 40 KeV. The dosage of about 10e3 atoms/cm$^2$ to about 50e5 atoms/cm$^2$ may be utilized. In FIG. 6d, once the p+ and n+ ion implantations are complete, the method 500 continues with block 550 in which a laser annealing 470 is performed at the backside surface 114 to activate the implantation. The laser annealing 470 requires a high temperature near the backside surface 114. The laser annealing 470 includes utilizing a power density ranging from 0.5 to about 10 J/cm$^2$. Accordingly, the metal layers 120, 122 of the image sensor 400 are not affected.

Figure 6E:
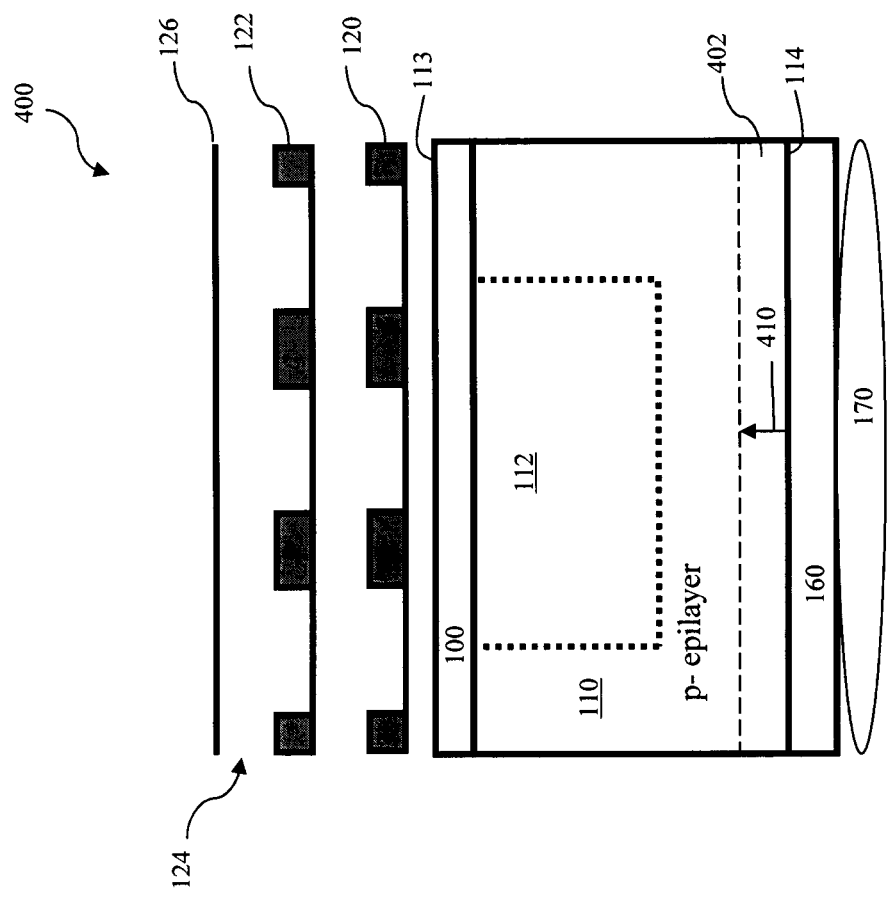

In FIG. 6e, a depletion region 402 is shown at the backside surface 114 and has a depth 410 that is 20% less than the thickness 420 of the substrate 110. The depth 410 of the depletion region 402 is preferably less than 1000 A. The depletion region 402 is associated with a junction of the p+ doped layer 455, n+ doped layer 465, and p− epilayer. Accordingly, the depth 410 of the depletion region 402 may be accurately determined and will depend on the formation (e.g., implantation energy, dosage, etc.) of the p+ doped layer 455 and n+ doped layer 465 in the p− epilayer as described in blocks 530 and 540.

The method 500 continues with block 560 in which a color filter layer 160 is formed over the backside surface 114. The color filter layer 160 may support several different color filters (e.g., red, green, and blue). The method 500 continues with block 570 in which a plurality of micro-lens(es) 170 may be formed over the color filter layer 160. The micro-lens(es) 170 are configured to focus light radiation directed towards the backside surface 114 to the light sensing region 112 of the image sensor 400. It has been observed that by providing the backside depletion region 402, dark current in the image sensor 400 is further reduced as compared to dark current generated in the image sensor 300 of FIG. 3. Further, a quantum efficiency of the image sensor 400 is substantially equivalent to a quantum efficiency of the image sensor 300 as shown below. Therefore, the image sensor 400 having the backside depletion region 402 further reduces dark current without degrading device performance.

Figure 7:
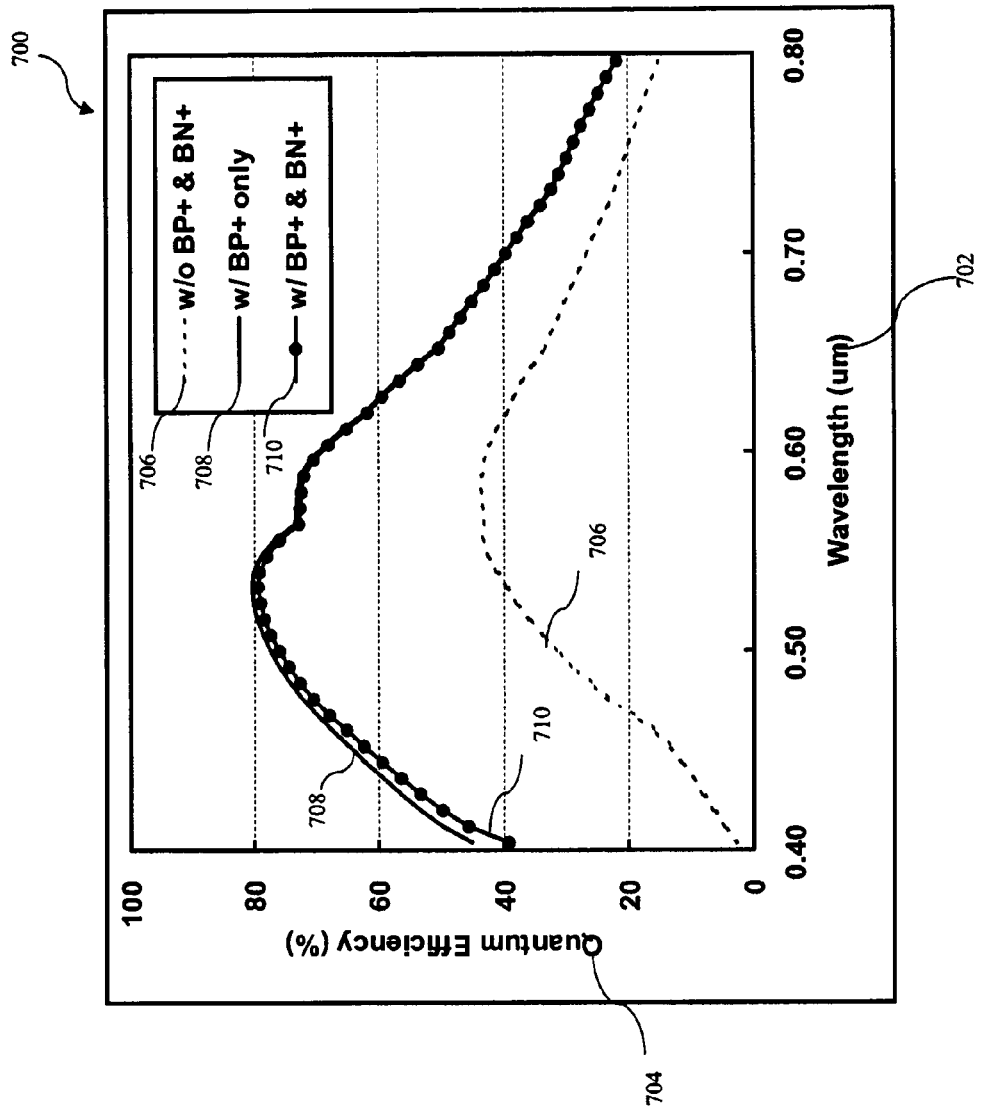
FIG. 7 is a graph illustrating a quantum efficiency of various image sensor configurations based on different light wavelengths.

Referring to FIG. 7, illustrated is a graph 700 showing a quantum efficiency (percentage of incident light (electrons) that is detected) of various image sensors based on different wavelengths of light radiation. In graph 700, the X-axis 702 represents various light wavelengths in μm. The Y-axis 704 represents the quantum efficiency of the image sensor. A curve 706 represents a backside illuminated image sensor (such as the image sensor 50 of FIG. 2) without a p+ doped layer and n+ doped layer implanted at the backside. A curve 708 represents a backside illuminated image sensor (such as the image sensor 300 of FIG. 3) with a p+ doped layer implanted at the backside. A curve 710 represents a backside illuminated image sensor (such as the image sensor 400 of FIG. 4) with a p+ doped layer and n+ doped layer (e.g., backside depletion region) implanted at the backside.

As shown in FIG. 7, the quantum efficiency (curve 708) of the backside illuminated image sensor 300 (FIG. 3) with the p+ doped layer implanted at the backside surface is substantially equal to the quantum efficiency (curve 710) of the backside illuminated image sensor 400 (FIG. 4) with the p+ doped layer and n+ doped layer (e.g., backside depletion region) implanted at the backside. In other words, the image sensors 300 and 400 have substantially the same photo sensitivity across the range of wavelengths. However, both of these image sensor 300 and 400 have a better quantum efficiency (curves 708 and 710) than the quantum efficiency (curve 706) of the backside illuminated image sensor 50 (FIG. 2) without a p+ doped layer and n+ doped layer implanted at the backside. That is, the photo sensitivity of the backside illuminated image sensors 300 (p+ doped layer at the backside) and 400 (p+ doped layer and n+ doped layer at the backside) is better than the image sensor 50 without the p+ doped layer and n+ doped layer implanted at the backside.

It should be noted that the type of dopants (e.g., n-type and p-type) and process parameters (e.g., implantation energy, dosage, etc.) used in the above embodiments are mere examples and that modifications are possible in the exemplary embodiments without materially departing from the novel teachings and advantages of this disclosure. For example, various features and the doping configurations disclosed herein may be reversed accordingly.

In summary, aspects of the present disclosure provides a method for reducing dark current for backside illuminated image sensors. During fabrication of the image sensor, the backside of the substrate is thinned to a reasonable thickness to provide for a desired photo response and reduce cross talk. However, this may damage the back surface of the substrate which can lead to an increase in dark current. By providing a depletion region at the backside, the charge carriers that are generated at the back surface in the absence of light radiation (e.g., dark current) may be collected in the backside depletion region and thus, do not reach the light sensing region of the photodiode. Thus, with the aspects of the present disclosure, dark current is reduced without degrading the quantum efficiency of the image sensor.

In one embodiment, a backside illuminated image sensor is provided, which includes a substrate having a front side and a backside, a sensor formed in the substrate at the front side, the sensor including at least a photodiode, and a depletion region formed in the substrate at the backside, wherein a depth of the depletion region is less than 20% of a thickness of the substrate. In some embodiments, the thickness of the substrate is about 1 μm to about 5 μm. In some other embodiments, the substrate is a type selected from the group consisting of: a p type substrate, an n type substrate, an epitaxial layer, silicon-on-insulator, silicon, and combinations thereof.

In other embodiments, the depth of the depletion region is less than 1000 A. In still other embodiments, the photodiode is a type selected from a group consisting of: a pinned layer photodiode and a non-pinned layer photodiode. In other embodiments, the sensor is a type selected from the group consisting of: an active pixel sensor and a passive pixel sensor. In other embodiments, the image sensor further includes a metal interconnection layer and interlayer dielectric formed on the front side of the substrate, a color filter formed on the backside of the substrate and aligned with the sensor, and a microlens formed over the color filter.

In another embodiment, a method for fabricating a backside illuminated image sensor is provided, which includes providing a substrate having a front side, a backside, and a first thickness, forming a plurality of sensors in the substrate at the front side, wherein each of the plurality of sensors includes at least a photodiode, reducing the thickness of the substrate from the first thickness to a second thickness, and forming a depletion region in the substrate at the backside, wherein a depth of the depletion region is less than 20% of the second thickness of the substrate. In some embodiments, the step of forming the depletion region includes: implanting ions of a first conductivity type at a first depth from the backside of the substrate, implanting ions of a second conductivity type at a second depth from the backside of the substrate, and performing laser annealing to activate the ions of the first conductivity type and ions of the second conductivity type. The first conductivity type is different from the second conductivity type and the second depth is less than the first depth.

In other embodiments, step of implanting ions of the first conductivity type includes utilizing a p-type dopant, an energy of 500 eV to about 50 KeV, and a dosage of 10e3 atoms/cm$^2$ to about 50e5 atoms/cm$^2$. In some other embodiments, the step of implanting ions of the second conductivity type includes utilizing an n-type dopant, an energy of 500 eV to about 40 KeV, and a dosage of 10e3 atoms/cm$^2$ to about 50e5 atoms/cm$^2$. In still other embodiment, the step of performing laser annealing includes utilizing a power density of about 0.5 J/cm$^2$ to about 10 J/cm$^2$. In other embodiments, the depth of the depletion region is less than about 1000 A. In other embodiments, the second thickness of the substrate is about 1 μm to about 5 μm.

In still another embodiment, a semiconductor device is provided, which includes a semiconductor substrate having a front surface and a back surface, a plurality of sensing elements formed in substrate underneath the front surface, wherein each of the sensing elements includes at least a photodiode for sensing light radiation directed towards the back surface, a first doped layer formed in the substrate at a first depth from the back surface, and a second doped layer formed in the substrate at a second depth from the back surface, the second depth being less than the first depth. A depth of a depletion region associated with the first and second doped layers is less than 20% of a thickness of the semiconductor substrate.

In some embodiments, the depth of the depletion region is less than about 1000 A. In some other embodiments, the thickness of the semiconductor substrate is about 1 μm to about 5 μm. In other embodiments, the first doped layer includes a p+ doped layer and the second doped layer includes an n+ doped layer. In still some other embodiments, the device includes a metal interconnection layer and interlayer dielectric formed on the front surface of the substrate, a color filter formed on the back surface of the substrate and aligned with the sensor, and a microlens formed over the color filter.

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments. For example, various features and the doping configurations disclosed herein may be reversed accordingly.

Although only a few exemplary embodiments of this invention have been described in detail above, those skilled in the art will readily appreciate that many modifications are possible in the exemplary embodiments without materially departing from the novel teachings and advantages of this invention. For example, the depletion region may be formed by implanting an n+ doped layer in the p− substrate instead of implanting a p+ doped layer and n+ doped layer in the p− substrate. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention. Several different advantages exist from these and other embodiments such as reduction of dark current without degradation to quantum efficiency, cost effective, and easy to manufacture.

What is claimed is:

1. A method for fabricating a backside illuminated image sensor, the method comprising:
   providing a substrate having a front side, a backside, and a first thickness;
   forming a plurality of sensors in the substrate at the front side, wherein each of the plurality of sensors includes at least a photodiode;
   reducing the thickness of the substrate from the first thickness to a second thickness;
   after reducing the thickness of the substrate from the first thickness to the second thickness, forming a first doped region in the substrate proximate to the back side, the first doped region having a first conductivity type; and
   forming a second doped region in the semiconductor substrate adjacent to the first doped region such that the second doped region is positioned between the first doped region and the backside of the semiconductor substrate, the second doped region having a second conductivity type that is opposite the first conductivity type.

2. The method of claim 1, wherein forming the first doped region includes implanting first ions of the first conductivity type at a first depth from the backside of the substrate; and
   wherein forming the second doped region includes implanting second ions of the second conductivity type at a second depth from the backside of the substrate, the second depth being less than the first depth.

3. The method of claim 2, wherein the implanting ions of the first conductivity type includes utilizing a p-type dopant, an energy of 500 eV to about 50 KeV, and a dosage of 10e3 atoms/cm$^2$ to about 50e5 atoms/cm$^2$.

4. The method of claim 2, wherein the implanting ions of the second conductivity type includes utilizing an n-type dopant, an energy of 500 eV to about 40 KeV, and a dosage of 10e3 atoms/cm$^2$ to about 50e5 atoms/cm$^2$.

5. The method of claim 2, wherein the performing laser annealing includes utilizing a power density of about 0.5 J/cm$^2$ to about 10 J/cm2.

6. The method of claim 1, wherein the second thickness of the substrate is about 1 μm to about 5 μm.

7. The method of claim 1, further comprising:
   forming a metal interconnection layer and an interlayer dielectric on the front side of the substrate;
   forming a color filter on the backside of the substrate and aligned with the sensor; and
   forming a microlens formed over the color filter.

8. The method of claim 1, further comprising performing an annealing process to activate the first and second ions.

9. The method of claim 1, further comprising forming a microlens over the backside of the substrate.

10. A method comprising:
    providing a semiconductor substrate having a first side and an opposing second side, the semiconductor substrate having a first conductivity type and a first doping concentration;
    forming a sensor in the semiconductor substrate at the first side;
    forming a first doped region in the semiconductor substrate proximate to the second side, the first doped region having the first conductivity type and a second doping concentration that is different than the first doping concentration;
    forming a second doped region in the semiconductor substrate adjacent to the first doped region such that the second doped region is positioned between the first doped region and the second side of the semiconductor substrate, the second doped region having a second conductivity type that is opposite the first conductivity type; and
    forming a color filter on the second side of the semiconductor substrate that is aligned with the sensor.

11. The method of claim 10, further comprising forming an interconnect structure on the first side of the semiconductor substrate.

12. The method of claim 10, further comprising performing a laser annealing process at the second side of the semiconductor substrate.

13. The method of claim 10, removing a portion of the semiconductor substrate adjacent the second side prior to forming the second doped region.

14. The method of claim 10, wherein the second doping concentration is greater than the first doping concentration, and
    wherein the first conductivity type is p-type and the second conductivity type is n-type.

15. A method comprising:
    providing a semiconductor substrate having a first surface and an opposing second surface, wherein the semiconductor substrate has a first thickness extending from the first surface to the second surface;
    forming a sensing element in the semiconductor substrate proximate the first surface, wherein the sensing element is operable to sense light radiation directed towards the second surface;
    forming an interconnection layer on the first surface of the semiconductor substrate;
    removing a portion of the semiconductor substrate including the second surface such that the thickness of the semiconductor substrate is reduced from the first thickness to a second thickness, wherein the second thickness extends from the first surface to an opposing third surface of the semiconductor substrate;
    after removing the portion of the semiconductor substrate, forming a first doped region in the semiconductor substrate at a first depth from the third surface;
    forming a second doped region in the semiconductor substrate at a second depth from the third surface, the second depth being less than the first depth such that the second doped region is located between the first doped region and the third surface of the semiconductor substrate; and performing a laser annealing process at the third surface of the semiconductor substrate.

16. The method of claim 15, wherein the semiconductor substrate has a first conductivity type and a first doping concentration,
wherein the first doped region has the first conductivity type and a second doping concentration that is different than the first doping concentration, and
wherein the second doped region has a second conductivity type that is opposite the first conductivity type.

17. The method of claim 16, wherein the first conductivity type is p-type and the second conductivity type is n-type.

18. The method of claim 15, further comprising:
forming a color filter formed on the third surface of the semiconductor substrate; and
forming a microlens on the color filter.

19. The method of claim 15, wherein the sensing element in the semiconductor substrate includes:

a third doped region extending from the first surface to a fourth depth into the semiconductor substrate from the first surface,
a fourth doped region extending from the first surface to a fifth depth into the semiconductor substrate from the first surface, and
a fifth doped region extending from the first surface to a sixth depth into the semiconductor substrate from the first surface, and
wherein the fourth depth is less than the fifth depth and wherein the fifth depth is less than the sixth depth.

20. The method of claim 15, wherein forming the first doped region in the semiconductor substrate at the first depth from the third surface includes implanting ions of a first conductivity type, and
wherein forming the second doped region in the semiconductor substrate at the second depth from the third surface includes implanting ions of a second conductivity type, the second conductivity type being different from the first conductivity type.

* * * * *